United States Patent [19]

Chaffin et al.

[11] Patent Number: 5,031,007
[45] Date of Patent: Jul. 9, 1991

[54] SLS COMPLEMENTARY LOGIC DEVICES WITH INCREASE CARRIER MOBILITY

[75] Inventors: Roger J. Chaffin; Gordon C. Osbourn; Thomas E. Zipperian, all of Albuquerque, N. Mex.

[73] Assignee: Sandia Corporation, Albuquerque, N. Mex.

[21] Appl. No.: 604,399

[22] Filed: Oct. 26, 1990

Related U.S. Application Data

[63] Continuation of Ser. No. 812,576, Dec. 23, 1985, abandoned.

[51] Int. Cl.$^5$ .......................................... H01L 29/80
[52] U.S. Cl. ........................................ 357/22; 357/4; 357/16; 357/42; 357/44
[58] Field of Search ...................... 357/4, 15, 16, 22 A, 357/42, 44

[56] References Cited

U.S. PATENT DOCUMENTS

| | | | |
|---|---|---|---|
| 3,609,252 | 9/1971 | Broce et al. | 357/23.1 X |
| 4,607,272 | 8/1986 | Osbourn | 357/61 X |
| 4,616,241 | 10/1986 | Biefeld et al. | 357/17 X |
| 4,665,415 | 5/1987 | Esaki et al. | 357/16 X |

OTHER PUBLICATIONS

G. Osbourn, "Electronic Properties of Strained-Layer Superlattices", J. Vac. Sci. Technol. B1(11), Apr.-Jun. 1983, pp. 379-382.
R. Zuleeg et al., "Double-Implanted GaAs Complimentary JFET's", IEEE Electron Device Letters, vol. EDL-5, No. 1, Jan. 1984, pp. 21-23.
R. Eden et al., "Integrated Circuits: The Case for Gallium Arsenide", IEEE Spectrum, Dec. 1983, pp. 30-37.
T. E. Zipperian et al., "InGaAs/GaAs, Strained-Layer Superlattice (SLS), . . . " IEDM 1984, Dec. 1984, pp. 524-527.
T. E. Zipperian et al., "Strained-Quantum-Well, Modulation-Doped, Field-Effect Transistor", Electronics Letters, Aug. 1985, pp. 823-824.
G. C. Osbourn et al., "Carrier Transport Coefficients Across GaAs, GaAlAs (100) Interpaces", J. Vac. Sci. Technol., 16(5), Sep./Oct. 1979, pp. 1529-1532.

Primary Examiner—Andrew J. James
Assistant Examiner—Sara W. Crane
Attorney, Agent, or Firm—George H. Libman

[57] ABSTRACT

In an electronic device comprising a semiconductor material and having at least one performance characteristic which is limited by the mobility of holes in the semiconductor material, said mobility being limited because of a valence band degeneracy among high-mobility and low-mobility energy levels accessible to said holes at the energy-momentum space maximum, an improvement is provided wherein the semiconductor material is a strained layer superlattice (SLS) whose layer compositions and layer thicknesses are selected so that the strain on the layers predominantly containing said at least one carrier type splits said degeneracy and modifies said energy levels around said energy-momentum space maximum in a manner whereby said limitation on the mobility of said holes is alleviated.

9 Claims, 2 Drawing Sheets

S.L.S COMPLEMENTARY HIGH SPEED LOGIC

P-SLS WITH HIGH HOLE MOBILITY

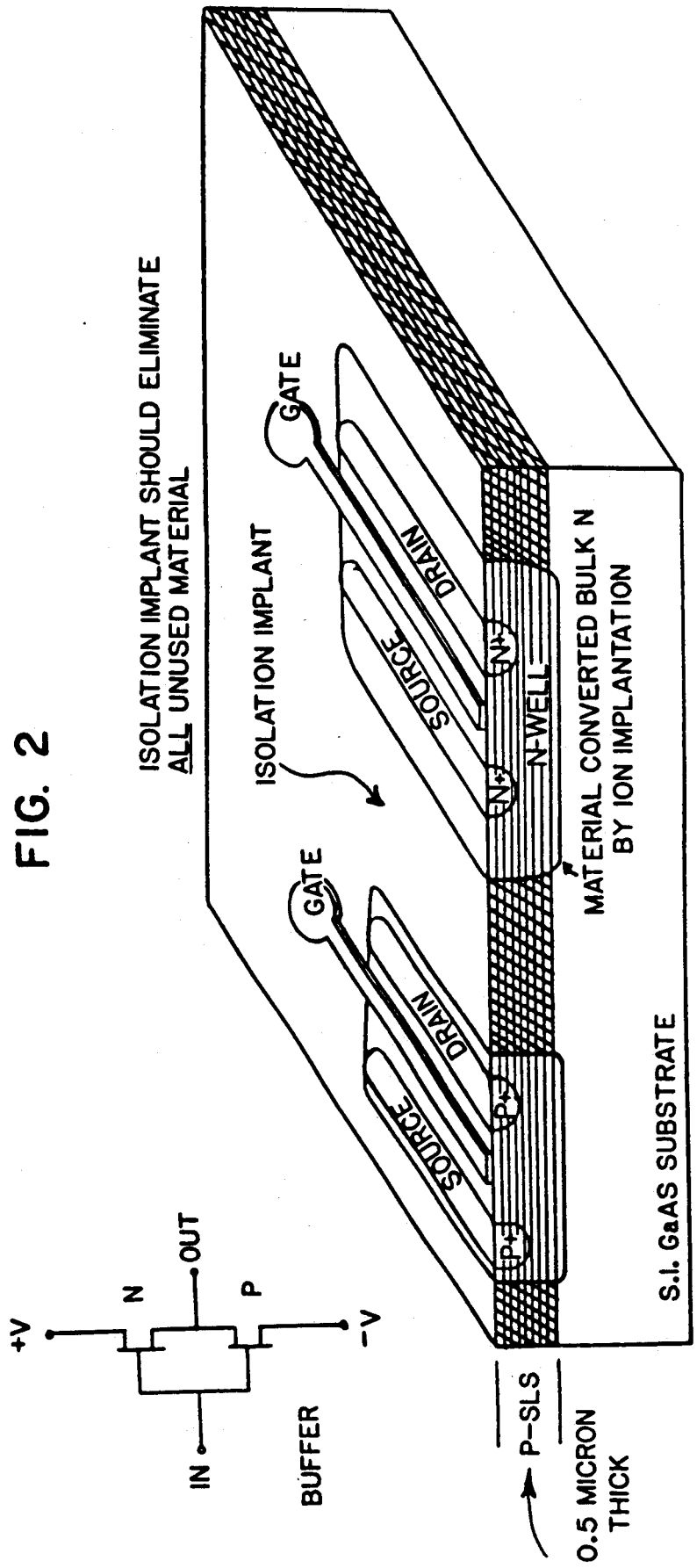

1

SLS COMPLEMENTARY LOGIC DEVICES WITH INCREASE CARRIER MOBILITY

The U.S. Government has rights in this invention pursuant to Contract No. DE-AC04-76DP00789 between the U.S. Department of Energy and AT&T Technologies, Inc.

This application is a continuation of Ser. No. 06/812,576, filed Dec. 23, 1985, now abandoned.

BACKGROUND OF THE INVENTION

This invention relates to improved semiconductor devices, especially those wherein high switching speeds and low power dissipation are desirable, e.g., logic and memory elements.

Logic and memory devices that operate at high speeds and low power levels are very important for computer and other applications. This is becoming even more important as VLSI circuits, with 10,000 or more gates per chip, are being developed. In silicon integrated circuits, the low power logic is CMOS (Complementary Metal Oxide Semiconductor; see, e.g., Sze, *Physics of Semiconductor Devices,* J. Wiley & Sons, 1981; DiLorenzo et al, *GaAs FET Principles and Technology,* Artech House, 1982; and *Electronic Circuits Discrete and Integrated,* Schilling et al, McGraw Hill, 1979, which disclosures are entirely incorporated by reference herein.) Silicon CMOS circuits with power dissipations of about 1 microwatt/gate are possible. The sacrifice made for low power operation of silicon CMOS is speed. Typically, at 1 uW/gate, the Si-CMOS delay is ~ 1 $\mu$sec/gate. The limiting factors are the carrier mobilities.

Other materials (such as gallium arsenide) offer higher speed (thus, smaller delays) but at greatly increased power consumption (Eden et al., "Integrated Circuits, a Case for GaAs", IEEE Spectrum, 12/83, 31ff, e.g., FIG. 1). The higher speed results from the fact that electron mobilities in GaAs are about 5000 $cm^2$/V-sec (at $n = 10^{17} cm^{-3}$) compared to only 600 $cm^2$/V-sec in silicon. As Eden et al shows, GaAs has been used to make some of the fastest logic devices ever made.

Complementary logic works well in silicon because electron and hole mobilities are similar, 600 and 300 $cm^2$/V-sec respectively. In GaAs (and other compound semiconductors) the electron and hole mobilities are quite different, e.g., 6000 and 250 $cm^2$/V-sec, respectively, in GaAs. As a result, conventional complementary GaAs logic would be only marginally faster than in silicon and creates a further complication wherein the area of the p-type device must be an order of magnitude larger than the n-type device to match currents (Zuleeg, et al, "Double Implanted GaAs Complementary J-FET's", IEEE, El. Dev. Lett. EDL-5, January 1984, p. 21, whose disclosure is incorporated by reference herein). In GaAs designs then, the complementary configuration is suggested only when a power dissipation reduction is necessary despite the lack of increased speed. If the hole mobilities were high in GaAs-like materials, then high-speed, low power complementary logic could be made.

As can be seen, there remains a need for semiconductor devices which have an improved power-delay product, i.e., have shorter delay times and lower power dissipations.

SUMMARY OF THE INVENTION

Accordingly, it is an object of this invention to provide a method for increasing the mobility of holes in semiconductor materials.

It is another object of this invention to utilize strained layer superlattice (SLS) structures to effect such mobility increases.

It is still another object of this invention to achieve such increases using SLS structures whereby the effect of the accompanying lateral strain perturbs the energy level configuration of the semiconductor such that the light hole and heavy hole valence band degeneracy is split.

It is a further object of this invention to provide improved semiconductor devices which are based on such SLS-based semiconductor materials.

It is yet another object of this invention to provide such devices having relatively well matched and high hole mobilities whereby they are useful in complementary logic configurations where short switching delay times and low power dissipations can be achieved.

Upon further study of the specification and appended claims, further objects and advantages of this invention will become apparent to those skilled in the art.

The objects have been achieved by providing, in an electronic device comprising a complementary logic or memory device; wherein, in the alternating layer system if the SLS, the layers in which the holes are localized also have the larger lattice constant, whereby these layers possess hole carriers having increased mobilities with respect to those in the same material when in bulk form; wherein the device comprises one n-FET and one p-FET and wherein the device is incorporated into an integrated circuit.

BRIEF DESCRIPTION OF THE DRAWINGS

Various other objects, features and attendant advantages of the present invention will be more fully appreciated as the same become better understood when considered in conjunction with the accompanying drawings, and wherein:

FIG. 1A shows the bulk laterally strained layer, FIG. 1B the resulting energy-momentum diagram and FIG. 1C the SLS layers themselves; and FIG. 2 illustrates one typical configuration of a device of this invention, i.e., a complementary digital logic unit based on a Schottky barrier depletion mode Field Effect Transistor (FET).

DETAILED DISCUSSION

Figure 1A:
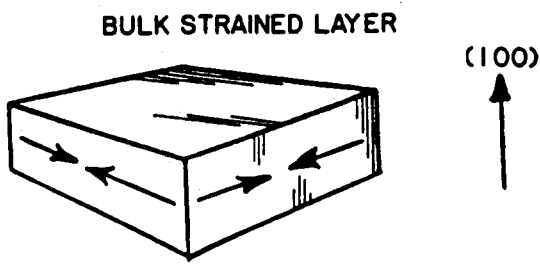
FIGS. 1A–1C illustrate a typical SLS system of the invention where

In GaAs-like materials the hole mobilities are low because the valence band is degenerate, containing both light and heavy holes at the energy-momentum maximum. It is the heavy holes which cause the average hole mobility to be low in conventional GaAs and related Group III/V or other compound semiconductor materials. It has been shown by Bir et al, *Symmetry and Strain Induced Effects in Semiconductors,* John Wiley & Sons, 1974, in zincblende semiconductors that the application of (100) uniaxial or biaxial stresses can cause this valence band degeneracy to split in energy. It has now been discovered that, additionally, the energy versus k-vector curves and the effective mass distributions of the holes can be changed in an SLS as a result of the strain perturbation in a fashion which significantly increases the mobilities of the holes.

Herein, the term "superlattice" has its conventional meaning. That is, it is a semiconductor entity which comprises alternating layers of two different semiconductor materials, one forming quantum well layers (narrower gap in bulk) and the other forming barrier layers (wider gap in bulk). The alternating nature of the structure quantizes the available energy levels in the quantum well layers. The set of alternating layers forms a new semiconductor material having its own new set of semiconductor properties, including bandgap, lattice constant, transport properties, conduction band structure, valence band structure, etc. In essence, a superlattice is achieved when the unit-cell thickness, i.e., the sum of the quantum well layer thickness and the barrier layer thickness, is less than the mean free paths of the carriers in all significantly occupied energy levels.

Superlattice structures per se are known and are described in many publications and patent applications. In essence, a superlattice effect will be achieved if the thickness of the alternating layers is appropriately and conventionally selected to be sufficiently thin that the necessary quantum effect occurs in the narrower gap layers, i.e., in the quantum well layers. The wide gap barrier layers form a potential energy barrier for each of the narrower gap quantum well layers. The high potential energy at the layer interfaces "traps" the carriers in the lower energy narrower gap material and forms the basis for a quantized energy band structure therein.

In strained layer superlattices the layers are not lattice matched. The foregoing references discuss the requirements for achievement of these strained layer superlattices. In such structures, the lattice mismatch is essentially totally accommodated by uniform lattice strain so that no misfit dislocations are generated at the interfaces. This will occur as long as the conditions described in the cited references are met, including satisfaction of a maximum mismatch degree (typically around 7-9% difference in lattice constants) and adequately thin layer thicknesses (e.g., generally less than about 500 angstroms and usually much lower, e.g., less than 200 angstroms or preferably less than 100 angstroms). In SLS's, misfit dislocations are suppressed because they become energetically unfavorable. Very advantageously, SLS structures act as barriers to dislocation propagation from underlying layers, e.g., from graded layers having a topmost lattice constant fairly well matched to the superlattice lattice constant or even from underlying layers which have significantly different lattice constants. It is this feature of isolating dislocations in the underlying substrate from the superlattice per se which significantly increases the latitude in selection of substrate materials for use in the devices of this invention.

Latitude in materials is also increased since the absence of a lattice matching requirement enables growth of SLS's from a wide variety of alloy systems as long as the maximum degree of lattice mismatch and the layer thicknesses which are permitted thereby are not exceeded. For a given lattice mismatch, for a given semiconductor system, there will be a maximum layer thickness at which SLS effects will be observed. In general, the greater the lattice mismatch, the thinner the layers must be. Detailed relationships of this nature are contained in the foregoing references.

The absence of misfit defects allows the strained layer superlattices to have crystalline quality equal to that of conventional semiconductor materials. This crystallinity can be maintained even when the subtrate has threading dislocations. The latter will be forced to propagate parallel to the SLS interfaces due to the strains of the layers. Hence, they will be confined to the first few SLS layers and will not degrade the crystal quality of the bulk of the SLS.

These SLS's can be made with built-in compressive strains of a proper orientation to effect a degeneracy splitting as described above which produces the desired increase in hole mobility. In a typical SLS, there are two compositions. Each layer has one of the compositions and the two alternate. As discussed in the references cited above, especially in Osbourn, J. Vac. Sci. Technol. B. 1(2), 1983, 379ff, a wide variety of compositions and/or layer thicknesses can be chosen to produce a single desired overall SLS semiconductor property or to produce a wide variety of combinations of desired properties. Since the lattice constants of adjacent layers will be different (the compositions are different), the layers will alternately be in compression and in tension as shown in FIG. 1C. Where it is desired to improve the mobility characteristics of holes, the quantum well containing layers will be chosen to be those which simultaneously have the highest bulk valence band maxima energy (the most holes) and the larger of the two lattice constants (compression from the smaller lattice constant layer). Thus, the free holes will reside in these quantum well layers under compression.

For example, in one exemplary SLS system based on layers of $In_xGa_{1-x}As/In_yGa_{1-y}As$, the portions of the SLS with the most indium, e.g., x greater than y, will be in the compressive strain state and will contain the mobile holes. Where desirable, electrons can be made to reside in the quantum well-containing layers by appropriately varying these parameters as discussed, e.g., in the patent applications cited above.

Without intending to limit this invention in any way, the underlying phenomena causing the increased mobilities or other modified mobilities in accordance with this invention can be explained in terms of changes in the structures of the energy band versus k-curve and the effective carrier mass curve associated therewith upon going from bulk materials to SLS quantum well-containing materials.

Calculations based on empirical tight binding approximations well known to those skilled in the art (see, e.g., Osbourn, J. Appl. Phys., 53(3), 1586 (1982); and Osbourn et al., J. Vac. Sci. Technol. 16(5), Sept./Oct., 1529 (1979), G. C. Osbourn, Superlattices and Microstructures 1(3), 223 (1985), J. E. Schirber et al, Appl. Physics, Lett. 46, 1984 (1985)) have demonstrated the nature of the effects on these functions. They show that the valence band effective masses for hole carriers in Group III/V materials are significantly affected in SLS's.

As discussed above, it is the heavy holes which have the low mobilities (high effective masses) and cause the observable hole mobility to be unsatisfactorily low. Since the light hole and heavy hole bands are degenerate, both are populated (the heavy hole bands are preferentially populated due to the larger density of states) in the bulk material. The calculations show that the valence band effective masses along the plane normal to (100) are significantly modified from these bulk values upon splitting of the degeneracy. This modification occurs over an energy range less than the energy splitting of the valence band maximum. When the strain is such that the original band with the heavy hole mass along the (100) direction is split to become the uppermost valence maximum, then the SLS mass value in the (100) plane will be nearly equal to that of the original unstrained light hole mass value. Biaxial stresses (SLS's) which cause this effect are those which impose compressive strain in the (100) plane and expansion in the direction normal to this plane. This case is schematically illustrated in FIGS. 1A and B.

Figure 1B:
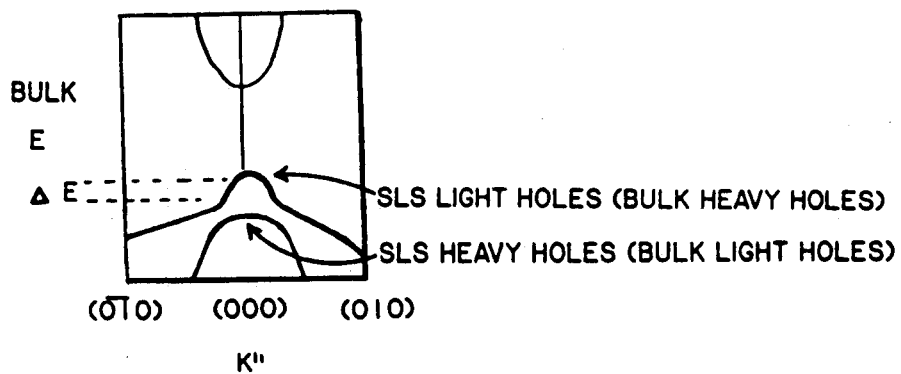
Figure 1C:
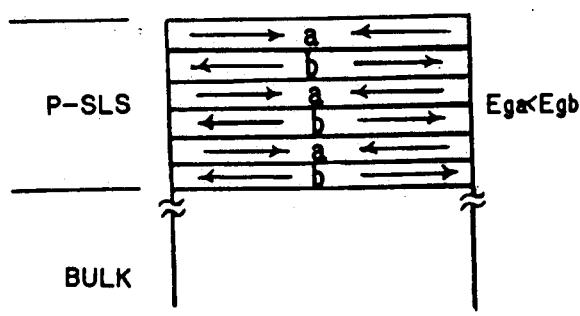

As shown in FIG. 1B, the quantum mechanical perturbation caused by the strain effects a change in the energy band and effective mass structures such that the original heavy hole band takes on the characteristics of the original light hole band in the (100) plane and vice versa. Accordingly, the lowest lying energy band is the one which originally was the heavy hole band but in its SLS configuration has light hole properties in the (100) plane, i.e., low effective masses and correspondingly higher mobility values.

It is also possible to modify the bulk structure in a way that the original band having a light hole mass along the (100) direction is split to become the uppermost valence maximum. In this case, it has SLS mass values in the (100) plane which are significantly larger than its original unstrained light hole mass but which are still less than the original average unstrained heavy hole mass. Were such modifications to be desirable in a unique combination of circumstances, this invention accommodates the same. The nature of the biaxial strain which causes such an effect can be fully conventionally determined in detail using the calculation methods discussed above.

The energy separation $\Delta E$ depicted in FIG. 1B depends on the magnitude of the layer strain, i.e., the strain magnitude which can be generated in SLS's as discussed in the foregoing references. Typically, $\Delta E$ values will be equal to or less than about 100meV. At relatively high temperatures, then, it would appear possible that the SLS heavy hole band will be sufficiently populated to deleteriously affect the nature of the improvement derivable by this invention. However, at low temperatures, e.g., 77° K. and for the typically low fields in the source and drain regions in conventional FET-type devices, the high mobility holes in the SLS should not significantly scatter into the low mobility, nearby lying valence band maximum.

Thus, where $\Delta E$ is so small that cooling is necessary for the foregoing reasons, then cooled devices are preferred in this invention. Of course, uncooled devices are also within the scope of this invention. In general, the cooled devices will be preferred since higher mobilities will be achieved. Of course, any degree of cooling is included within the scope of this invention; the value of 77° K. is merely convenient since it is the boiling point of liquid nitrogen. Even cooler temperatures can be employed where the expense and difficulty is warranted.

Where the lower mobility portions of the valence bands do become significantly occupied by holes, e.g., at higher fields, then the conventional Gunn-like effect mentioned in several of the references discussed above will be observed due to the decrease in carrier mobility. It is preferred that this effect be avoided in the low field portions of the FET's of this invention.

In such FET's and related devices, the improvement in mobility provided by this invention is an important one, not only for the carriers per se as they move in the FET channel, but also in lowering the parasitic resistances in these devices.

The foregoing effects have been demonstrated in calculations based on empirical tight binding approximations. Good agreement between these calculations and experimental results have been observed in many SLS systems. Hence, such calculations provide highly reliable bases for fabricating the devices of this invention. Typically, irrespective of the fine details of the tight binding model, the predicted behavior and associated device parameters, e.g., layer thicknesses, layer compositions, etc., in conjunction with the usual considerations of superlattice requirements, will provide a reliable basis for formulating an initial device design. It will then be possible to routinely optimize device design, e.g., with a few routine experiments.

In selecting candidate materials for use in the quantum well layers of the superlattices of the devices of this invention, a primary criterion where hole mobility is to be increased is that the quantum well materials have a bandgap as small as possible, i.e., have light hole masses as small as possible. The largest mobility increases will be seen in such materials at the lowest electric fields. Where electron mobility is to be increased, corollary principles apply.

Quantum well layer thicknesses will typically be less than 100 angstroms for devices, e.g., FET's operating at room temperature, or preferably even lower temperatures. Barrier layer thicknesses will be in the same range as normally required in conventional SLS's, e.g., 50-400 angstroms. The total number of alternating layers will be conventionally determined to provide the desired operating characteristics for the device in its end-use environment. Basically, the thickness of the superlattice will be determined by the same requirements which determine the thickness of conventional device channels. For example, in an FET, for a given carrier concentration and a given set of operational requirements, the number of layers and, hence, the overall superlattice channel thickness will be chosen to provide the necessary depletion layer thickness in the region connecting the source and the drain via the conventional gate.

In essence, there is no limitation on the nature of the semiconductor compositions which can be used in the quantum well and/or the barrier layers. As long as the foregoing requirements are met, the corresponding superlattice device will operate as described. Particularly preferred semiconductor materials are those of groups III/V of the Periodic Table. Suitable semiconductors include binary, ternary, quaternary, etc., types. Typical materials include gallium arsenide, the indium gallium arsenide family, the indium arsenide antimonide family, the aluminum gallium arsenide family, etc. The same family can be used to fabricate the quantum well and the barrier layers if desired. In general, barrier materials having an aluminum component will be highly satisfactory. The well and barrier layer materials can be of the direct gap type but indirect materials can also be employed. The smallest hole masses are obtained when the direct gaps of the well and barrier layers are small.

In general, unless indicated otherwise herein, all details regarding the fabrication, design and use of the devices and especially the FET's of this invention will be entirely conventional, e.g., as described in many publications, including DiLorenzo et al., and others supra, Carrol, *Hot Electron Microwave Generators*, Arnold Publishers, London, 1970, etc.

A typical complementary logic FET structure is shown in FIG. 2. Source and drain regions can be formed by conventional means such as diffusion or, preferably, ion implantation. The carriers will move parallel to the planes of the superlattice layers. In order to improve transport between the edges of the source and drain regions and the channel region, diffusion or ion implantation alloying techniques can be used whereby very good contact is achieved along the interface of the source/channel and drain/channel regions. This ensures that the full superlattice structure is utilized. The alloying technique can intermix the layered SLS structure into a bulk alloy in the limited source and drain regions to achieve the desired good contact.

Conventional gate, source and drain electrodes can be employed. Preferably, a Schottky barrier gate is used in the depicted device. The gate voltage creates the necessary depletion in the channel region. It is also possible to use a buffer between the underlying substrate and the superlattice structure. This buffer is not required in all cases. Where there would be an otherwise unacceptable lattice mismatch between the superlattice and the substrate, a buffer will be employed. A typical buffer is a graded layer whose topmost layer closely matches the lattice constant of the superlattice. Conventional substrates can be employed, preferably semi-insulating substrates such as gallium arsenide which will reduce parasitic losses.

The basic device of FIG. 2 consists of two transistors, n-type and p-type, Schottky-barrier depletion mode Field Effect Transistors. The p-type device is a conventional depletion mode device made in the top 0.5 micrometer thick p-type SLS. To make the n-type device, a region of the SLS is converted to n-type using conventional ion implantation or diffusion. This region is labelled the n-well. The material in the n-well may or may not be still a superlattice since high electron-mobility is assured anyway in III/V materials. A conventional depletion mode device is then made in the n-well. This Schottky barrier (S.B.) device has a p-type FET (positive gate voltage turns it off) and an n-type S.B. FET (negative gate voltage turns it off). The remainder of the P-SLS layer (marked Isolation Implant on FIG. 2) is converted to an insulating state by conventional implantation techniques. If these devices are interconnected as shown in FIG. 2A, a simple logic buffer (the basic building block of more complex logic) will result. In this buffer, one transistor will be fully on and the other fully off in either logic state. This construction leads to the very low power consumption found in complementary logic. The fact that both the n- and p-type FET's use high mobility majority carriers will result in very high speeds and short propagation delays through the device. Hence, the so-called power delay (power-speed) product of this logic device should be better than conventional silicon CMOS or GaAs circuits, e.g., theoretically, on the order of about 1 fJ.

The improvement of this invention is applicable to many other conventional semiconductor device designs, and is not limited to the embodiment of FIG. 2. The complementary logic can have a p-well made in n-type SLS's. In addition, the device can be based on one of the many other types of FET's well known to those skilled in the art, including enhancement mode devices, J-FET's, MESFET's, etc. In all such devices, it will be possible to take advantage of the high speed provided by the use of materials having naturally high mobility in one carrier, e.g., electrons in group III/V materials, and of complementary logic (low power dissipation) by incorporating the details of this invention to increase the normally significantly lower mobility of the other carrier by fabrication of an SLS-containing device.

While improving the mobility characteristics of this carrier, per this invention, there will be no significant effect on the already good mobility of the other carrier, i.e., electrons in group III/V materials.

Contemplated equivalents within the scope of this invention also include the variety of SLS structures which can be designed utilizing straight-forward principles, e.g., as discussed in the many references described above, e.g., the first mentioned Osbourn reference. Thus, compositions which are ternary, quaternary, etc., can be used or more than two different kinds of alternating layers can be used, etc.

Similarly, although the foregoing discussion is in terms of SLS structures, it is also applicable to strained quantum well structures (SQW). These comprise a single quantum well layer sandwiched between two bulk material layers, e.g., a thin binary, ternary or other layer, e.g., $In_xGa_{1-x}As$ between two GaAs layers. As in SLS's, strain accommodation due to lattice mismatch between the thin layer and the outer sandwiching layers is provided by the single thin layers. In an SQW the latter is exposed to a higher strain than is a layer of an SLS, e.g., often on the order of about twice as high under comparable conditions. As a result, the critical layer thickness of the SQW layer is correspondingly smaller than in an SLS. Design of the SQW-based aspect of this invention is in accordance with the foregoing discussion except for conventional deviations where necessary as is well-known for SQW systems; see, e.g., Zipperian et al, Electronics Letters, 21, Aug. 1985, pp. 823-824 and Rosenberg et al, Electron Device Letters, Oct. 1985, p. 491, which disclosures are incorporated by reference herein. For example, the critical layer thickness values are different as mentioned above. As another example, the buffer layer ordinarily used in SLS structures (i.e., a layer, e.g., of a ternary material, between the SLS and the substrate, e.g., GaAs, which is matched to the SLS lattice constant and mismatched to the substrate) is usually not employed in SQW structures. The quantum well layer instead is adjacent to the two bulk layers, e.g., GaAs layers. This provides an advantage for SQW systems.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE

A high-mobility p-type SLS material ($In_{0.2}Ga_{0.8}As$/GaAs) was prepared having the degeneracy of the valence band removed at the Brillouin zone center. Details are reported in Schirber et al., Appl. Phys. Lett. 46, 15 Jan. 1985, which entire disclosure is incorporated by reference herein.

The preceding example can be repeated with similar success by substituting the generically or specifically described reactants and/or operating conditions of this invention for those used in the preceding example.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a complementary logic semiconductor device comprising at least one n-FET and at least one p-FET, the improvement wherein said p-FET is a strained layer superlattice comprising alternating quantum well and barrier layers of Group III/V semiconductors, said quantum well layers having a larger lattice constant than said barrier layers, said quantum well layers possess hole carriers having mobilities increased over those in the compositions of said quantum well layers when in bulk form.

2. The device of claim 1 wherein the FET's are Schottky-barrier, depletion mode FET's.

3. The device of claim 1, wherein the quantum well layers have a thickness less than about 100 angstroms.

4. The device of claim 1, further comprising, as a substrate for said superlattice, a semiconductor material having a lattice constant which does not substantially match that of said superlattice.

5. The device of claim 1 wherein said quantum well layer consists of $In_xGa_{1-x}As$ and said barrier layer consists of $In_yGa_{1-y}As$, where $x > y$.

6. The device of claim 1 wherein said quantum well layer consists of $InAs_xSb_{1-x}$ and said barrier layer consists of $In_yGa_{1-y}As$.

7. The device of claim 1 wherein said quantum well layer consists of $In_xGa_{1-x}As$ and said barrier layer consists of $Al_yGa_{1-y}As$.

8. In a complementary logic semiconductor device comprising at least one n-FET and at least one p-FET, the improvement wherein said p-FET is a strained quantum well structure comprising a single quantum well layer of Group III/V semiconductors sandwiched between two bulk material layers, said quantum well layer having a larger lattice constant than said bulk material layers, said quantum well layer possesses hole carriers having mobilities increased over those in the compositions of said quantum well layer when in bulk form.

9. The device of claim 8 wherein said quantum well layer consists of $In_xGa_{1-x}As$ and said sandwiching bulk layers each consist of GaAs.

* * * * *